(12) United States Patent
Yoon et al.

(10) Patent No.: US 7,981,594 B2
(45) Date of Patent: Jul. 19, 2011

(54) HARDMASK COMPOSITION HAVING ANTIRELECTIVE PROPERTIES AND METHOD OF PATTERNING MATERIAL ON SUSBSTRATE USING THE SAME

(75) Inventors: Kyong Ho Yoon, Daejeon-si (KR); Jong Seob Kim, Daejeon-si (KR); Dong Seon Uh, Seoul (KR); Hwan Sung Cheon, Seoul (KR); Chang Il Oh, Seongnam-si (KR); Min Soo Kim, Incheon-si (KR); Jin Kuk Lee, Gunpo-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 197 days.

(21) Appl. No.: 12/155,490

(22) Filed: Jun. 5, 2008

(65) Prior Publication Data

US 2008/0305441 A1     Dec. 11, 2008

(30) Foreign Application Priority Data

Jun. 5, 2007   (KR) .................. 10-2007-0055243

(51) Int. Cl.
| | |
|---|---|
| *G03F 7/11* | (2006.01) |
| *G03F 7/26* | (2006.01) |
| *G03F 7/004* | (2006.01) |
| *G03F 7/027* | (2006.01) |
| *G03F 7/028* | (2006.01) |
| *G03F 7/039* | (2006.01) |

(52) U.S. Cl. ............... 430/323; 430/271.1; 430/272.1; 430/313; 430/326; 430/449; 438/952; 528/153; 528/480

(58) Field of Classification Search .......... None
See application file for complete search history.

(56) References Cited

U.S. PATENT DOCUMENTS

| | | | | |
|---|---|---|---|---|
| 6,929,896 | B2 * | 8/2005 | Yamato et al. ............ 430/270.1 |
| 7,655,386 | B2 * | 2/2010 | Hyung et al. ................ 430/313 |
| 2006/0019195 | A1 * | 1/2006 | Hatakeyama et al. ..... 430/270.1 |
| 2006/0251990 | A1 | 11/2006 | Uh et al. | |
| 2006/0269867 | A1 * | 11/2006 | Uh et al. ................... 430/270.1 |
| 2007/0003863 | A1 | 1/2007 | Uh et al. | |
| 2007/0059635 | A1 * | 3/2007 | Oh et al. .................... 430/270.1 |
| 2007/0072111 | A1 * | 3/2007 | Oh et al. .................... 430/270.1 |
| 2007/0148586 | A1 | 6/2007 | Uh et al. | |
| 2008/0160461 | A1 * | 7/2008 | Yoon et al. ................... 430/323 |
| 2009/0176165 | A1 * | 7/2009 | Cheon et al. .................... 430/5 |

FOREIGN PATENT DOCUMENTS

| | | |
|---|---|---|
| KR | 10-2006-0132070 A | 12/2006 |
| KR | 10-2007-0002591 A | 1/2007 |
| KR | 10-0713231 B1 | 4/2007 |
| WO | WO-2007/139268 A1 * | 12/2007 |

OTHER PUBLICATIONS

Machine generated English translation of KR 10-2006-0132070 published Dec. 21, 2006, translation generated from KIPO website on Mar. 22, 2010, 14 pages.*
Machine generated English translation of KR 10-2007-0002591 published Jan. 5, 2007, translation generated from KIPO website on Mar. 22, 2010, 15 pages.*
Machine generated English translation of KR 10-0713231 published Apr. 24, 2007, translation generated from KIPO website on Mar. 22, 2010, 29 pages.*

* cited by examiner

*Primary Examiner* — Cynthia Hamilton
(74) *Attorney, Agent, or Firm* — Lee & Morse, P.C.

(57) ABSTRACT

A hardmask composition includes an organic solvent and one or more aromatic ring-containing polymers represented by Formula 1, 2 and 3:

Formula 1:

$$\left[\begin{array}{c} R_1 \\ \phantom{X} \\ R_2 \end{array}\begin{array}{c} R_1-R_3 \\ \text{(fluorene)} \\ R_2 \end{array}\right]_n,$$

Formula 2:

$$-\!\!\left[R_4-R_5\right]_n\!\!-, \text{ and}$$

Formula 3:

$$\left[\begin{array}{c} R_1 \\ \phantom{X} \\ R_2 \end{array}\begin{array}{c} R_1-R_3 \\ \text{(fluorene)} \\ R_2 \end{array}\right]_n\!\!-\!\!\left[R_4-R_5\right]_m\!\!-.$$

12 Claims, 11 Drawing Sheets and

PROVIDE MATERIAL LAYER ON A SUBSTRATE

FORM HARDMASK LAYER

FORM RADIATION-SENSITIVE IMAGING LAYER

PATTERNWISE EXPOSE RADIATION-SENSITIVE IMAGING LAYER

REMOVE PORTIONS OF EXPOSED IMAGING LAYER AND HARDMASK LAYER

ETCH MATERIAL LAYER

HARDMASK COMPOSITION HAVING ANTIRELECTIVE PROPERTIES AND METHOD OF PATTERNING MATERIAL ON SUSBSTRATE USING THE SAME

BACKGROUND OF THE INVENTION

1. Field of the Invention

Embodiments relate to a hardmask composition for lithography, the hardmask composition including one or more aromatic ring-containing polymers with a strong absorption in the short wavelength region (e.g., 157 nm, 193 nm, and 248 nm), and a method of patterning material on a substrate using the same.

2. Description of the Related Art

There is a continuous demand to reduce the size of structural shapes in the microelectronics industry and other related industries, including the manufacture of microscopic structures, e.g., micromachines, microelectromechanical systems (MEMS), and magneto-resistive heads. In the microelectronics industry, there exists a need to reduce the size of microelectronic devices in order to provide a number of circuits in a given chip size.

Effective lithographic techniques are essential to achieve a reduction in the size of structural shapes. Lithography affects the manufacture of microscopic structures from the viewpoint of direct imaging of patterns on particular substrates and production of masks typically used for such imaging.

For better resolution in most lithographic processes, an antireflective coating (ARC) is used to minimize the reflectivity between an imaging layer, e.g., a radiation-sensitive resist material layer, and an underlying layer. However, since many portions of the imaging layer are removed during etching of the ARC after patterning, patterning may be further required in the subsequent etching operation. That is, in some lithographic imaging processes, the resist does not provide resistance to the subsequent etching operation to an extent sufficient to effectively transfer the desired pattern to a layer underlying the resist.

In the case where an extremely thin resist layer is required, an underlying material to be etched is thick, a large etching depth is needed, and/or the use of a particular etchant is required depending on the type of an underlying material, a so-called 'hardmask layer' may be used as an intermediate layer between the patterned resist layer and the underlying material that can be patterned by transfer from the patterned resist. The hardmask layer should be able to receive the pattern from the patterned resist layer and withstand etching required to transfer the pattern to the underlying material.

Conventional hardmask materials are difficult to apply to substrates. Accordingly, the use of chemical and physical vapor deposition, special solvents, and/or high-temperature baking may be required. However, these methods not only necessitate the use of expensive equipment or the introduction of advanced techniques but also involve relatively complicated processes, thus incurring considerable production costs of devices. Thus, a hardmask composition that can be applied by spin-coating techniques would be desirable. A hardmask composition that can be selectively etched using an overlying photoresist layer as a mask in an easy manner while being resistant to etching necessary to pattern an underlying metal or silicon compound layer using a hardmask layer as a hardmask, would also be desirable. A hardmask composition that provides superior storage properties and avoids unwanted interaction with an imaging resist layer, e.g., avoids acid contamination from the hardmask, would further be desirable. A hardmask composition that has particular optical properties against imaging radiation at shorter wavelengths (e.g., 157 nm, 193 nm, and 248 nm) would also be desirable.

Numerous technical difficulties remain in patterning relatively thick underlying layers by dry etching. For example, an overlying hardmask layer formed by spin coating may have an isotropic, e.g., bowed, etch profile during dry etching, which makes it difficult to allow the hardmask layer to function as a hardmask of a relatively thick underlying layer. Attempts have been made to prevent the occurrence of isotropic etch profiles, for example, by varying dry etching conditions. However, device makers suffer from limitations in the operation of mass-production facilities. Accordingly, there is a need for advances in hardmask composition technology.

SUMMARY OF THE INVENTION

Embodiments are therefore directed to a hardmask composition having antireflective properties, and a method of patterning material on a substrate using the same, which substantially overcome one or more of the problems due to the limitations and disadvantages of the related art.

It is therefore a feature of an embodiment to provide a hardmask composition that exhibits high etch selectivity, is sufficiently resistant to multiple etching, and minimizes the reflectivity between a resist and an underlying layer.

It is therefore another feature of an embodiment to provide a method of patterning an underlying material layer on a substrate using the hardmask composition.

At least one of the above and other features and advantages may be realized by providing a hardmask composition, including (a) an organic solvent, and (b) one or more aromatic ring-containing polymers represented by Formulae 1, 2 and 3:

Formula 1:

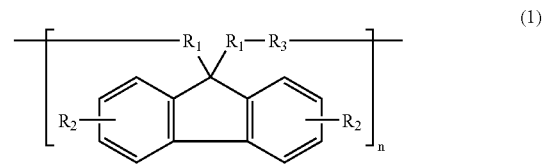

wherein each $R_1$ in Formula 1 is selected from:

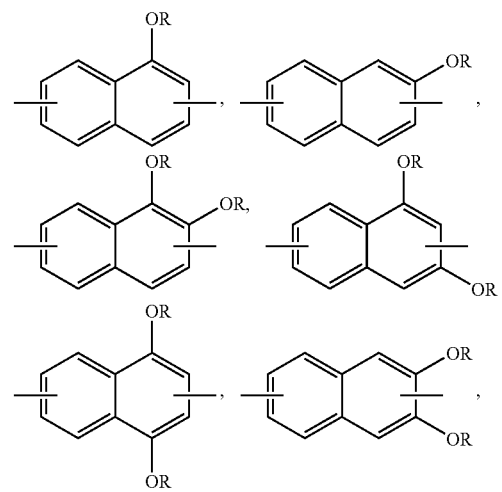

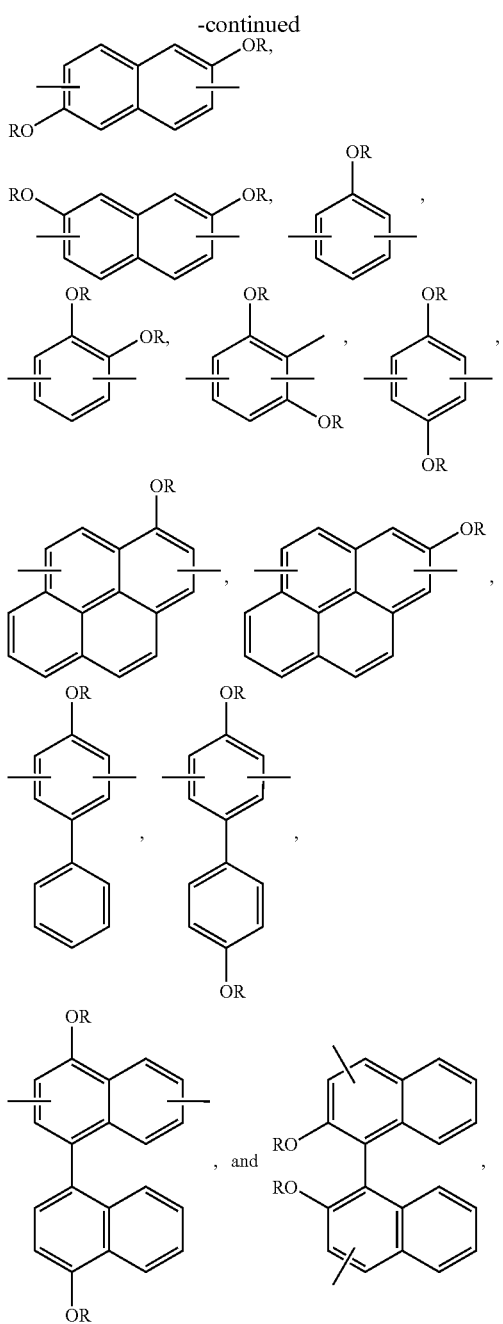
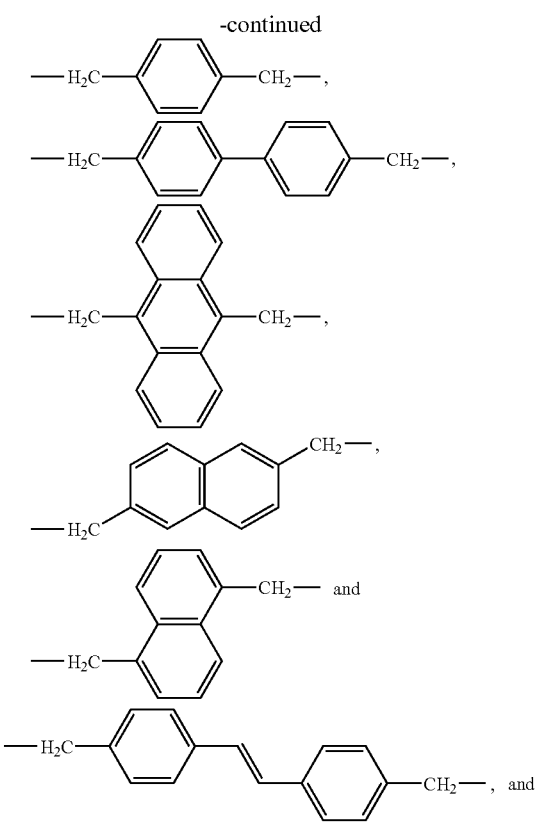
wherein n in Formula 1 satisfies 1≦n<750;
Formula 2:
$$-\!\!+\!\!R_4\!-\!\!R_5\!\!+\!\!_n-\qquad(2)$$
wherein $R_4$ in Formula 2 is selected from:
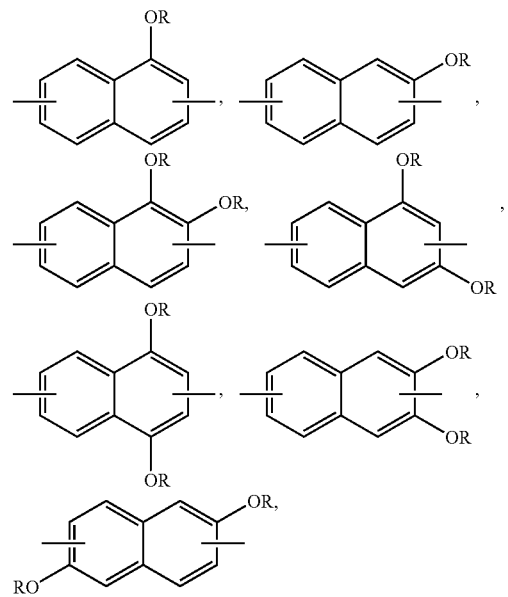
where, in $R_1$, R is H or alkyl,
wherein each $R_2$ in Formula 1 is selected from:
hydrogen, hydroxyl, $C_1$-$C_{10}$ alkyl, $C_6$-$C_{10}$ aryl, allyl and halogen,
wherein $R_3$ in Formula 1 is selected from:
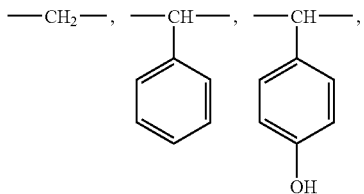

-continued

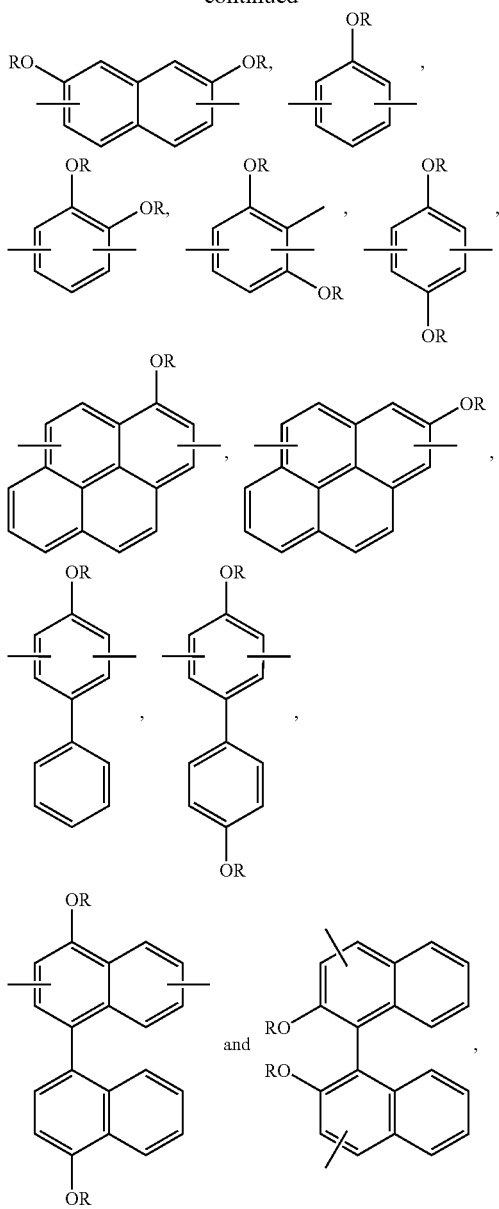

where, in $R_4$, R is H or alkyl,
$R_5$ in Formula 2 is selected from:

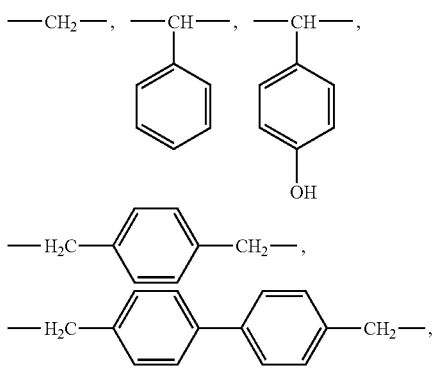

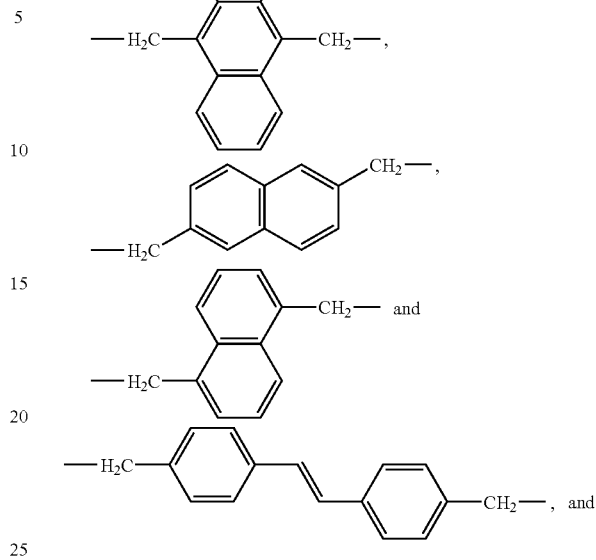

n in Formula 2 satisfies $1 \leq n < 750$; and
Formula 3:

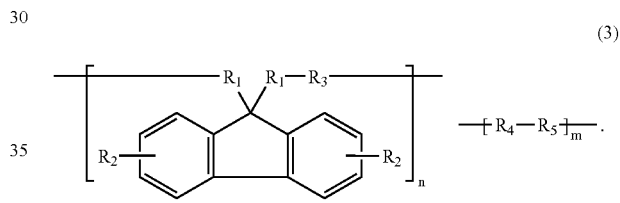

wherein $R_1$, $R_2$, $R_3$, $R_4$, $R_5$ and n in Formula 3 are the same as in Formulae 1 and 2, and
wherein m in Formula 3 satisfies $1 \leq m < 750$ and $2 \leq (m+n) < 1,500$.

The aromatic ring-containing polymer (b) may have a weight average molecular weight of about 1,000 to about 30,000. The composition may further include (c) a crosslinking component. The crosslinking component (c) may include one or more of a melamine resin, an amino resin, a glycoluril compound, or a bisepoxy compound. The composition may further include (d) an acid catalyst or a base catalyst. The composition may include the acid catalyst, and the acid catalyst may include one or more of p-toluenesulfonic acid monohydrate, pyridinium p-toluenesulfonate, 2,4,4,6-tetrabromocyclohexadienone, benzoin tosylate, 2-nitrobenzyl tosylate, or alkyl esters of organic sulfonic acids. The composition may include the base catalyst, and the base catalyst may include one or more ammonium hydroxides represented by $NH_4OH$ or $NR_4OH$, where R=alkyl.

The composition may include about 75 to about 98.8% by weight of the organic solvent (a), about 1 to about 20% by weight of the one or more aromatic ring-containing polymers (b), about 0.1 to about 5% by weight of the crosslinking component (c), and about 0.001 to about 0.05% by weight of the acid or base catalyst (d), percent by weight being determined based on the weight of (a)+(b)+(c)+(d). The composition may further include a surfactant.

At least one of the above and other features and advantages may also be realized by providing a method for patterning a material on a substrate, the method including providing a material layer on a substrate, forming a hardmask layer using the composition as claimed in claim 1 on the material layer, forming a radiation-sensitive imaging layer on the hardmask layer, patternwise exposing the radiation-sensitive imaging layer to radiation to form a pattern of radiation-exposed regions in the imaging layer, removing portions of the radiation-sensitive imaging layer and the hardmask layer to expose portions of the material layer, and etching the exposed portions of the material layer to pattern the material layer.

The method may further include forming a silicon-containing hardmask layer prior forming the radiation-sensitive imaging layer on the hardmask layer. The method may further include forming a bottom antireflective coating on the silicon-containing hardmask layer prior to forming the radiation-sensitive imaging layer on the hardmask layer.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Korean Patent Application No. 10-2007-0055243, filed on Jun. 5, 2007, in the Korean Intellectual Property Office, and entitled: "Hardmask Composition Having Antireflective Properties and Method of Patterning Material on Substrate Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, the expressions "at least one," "one or more," and "and/or" are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, the terms "a" and "an" are open terms that may be used in conjunction with singular items or with plural items. For example, the term "an acid catalyst" may represent a single compound, e.g., benzoin tosylate, or multiple compounds in combination, e.g., benzoin tosylate mixed with 2-nitrobenzyl tosylate.

As used herein, molecular weights of polymeric materials are weight average molecular weights, unless otherwise indicated.

Exemplary embodiments will now be described in greater detail.

Embodiments provide a hardmask composition characterized by the presence of one or more aromatic ring-containing polymers with a strong absorption in the short wavelength region, particularly, 248 nm or less. The hardmask composition may include (a) an organic solvent, and (b) at least one aromatic ring-containing polymer having a strong absorption in the short wavelength region (particularly, 248 nm or less). In an embodiment, the aromatic ring-containing polymer may be one or more polymers represented by Formulae 1, 2 and 3 below.

Figure 1:
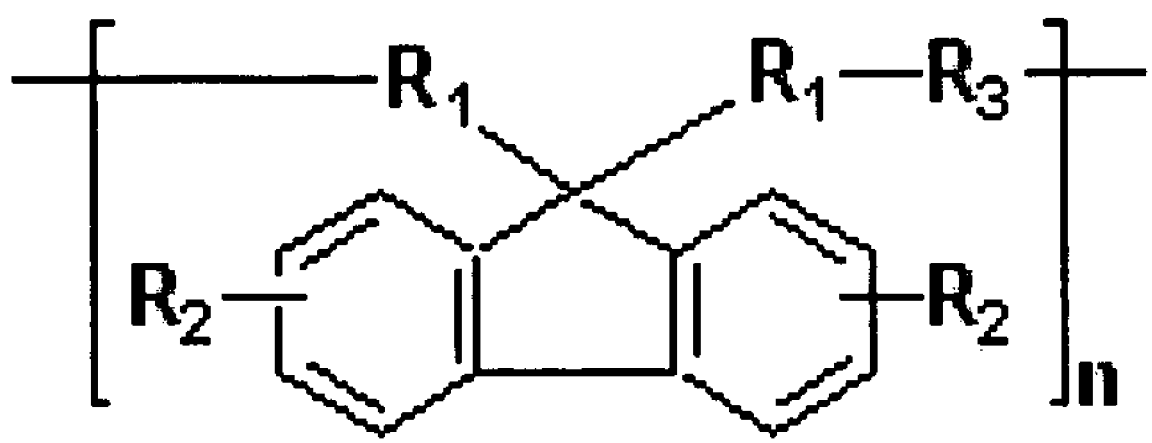
FIG. 1 illustrates Formula 1 of the hardmask composition according to an embodiment.

Formula 1 is reproduced in FIG. 1.

Formula 1:

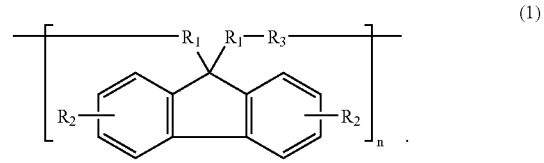

Figure 2:
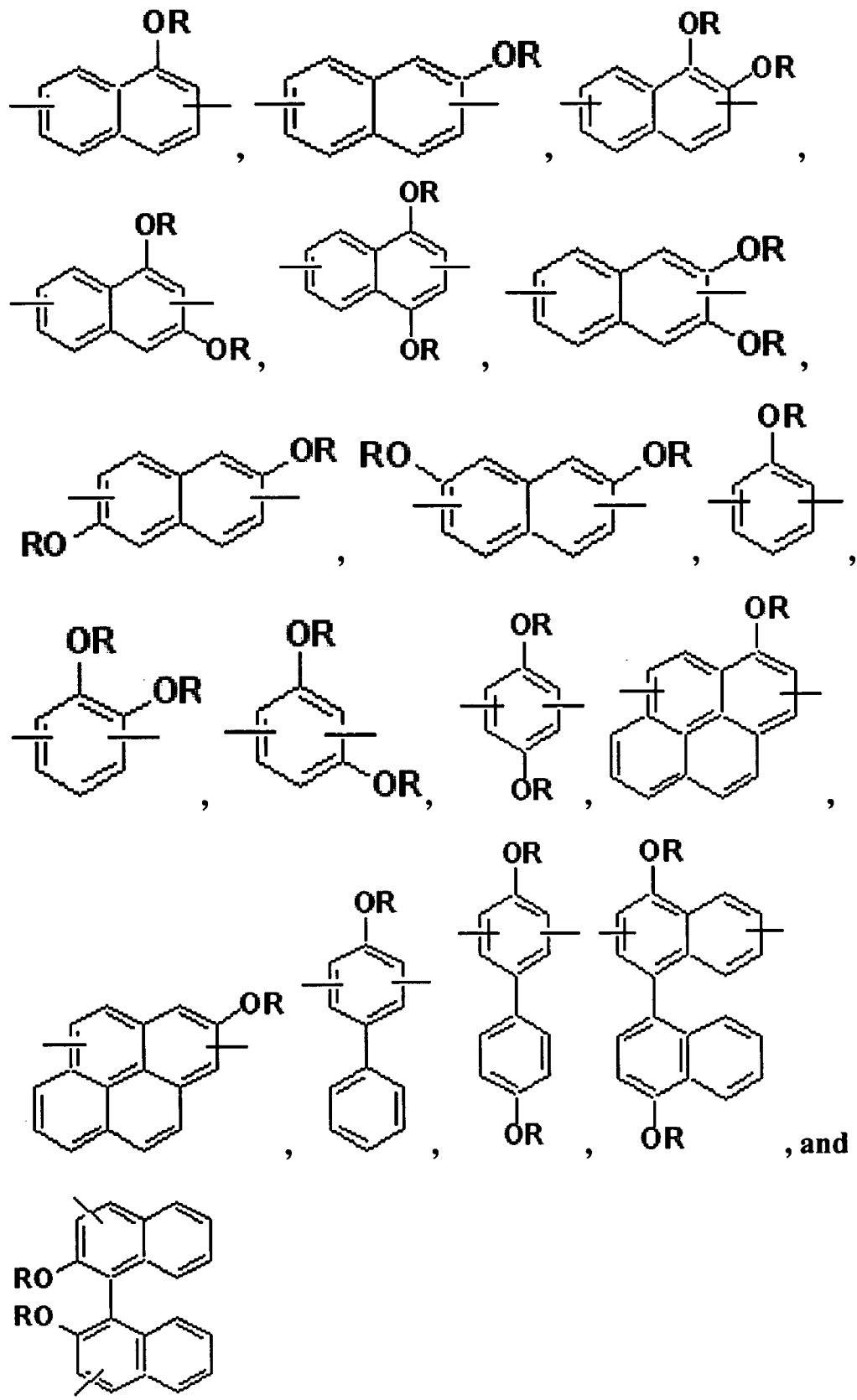
FIG. 2 illustrates example moieties corresponding to $R_1$ in Formula 1.

In Formula 1, $R_1$ may be one or more of the following moieties, which are reproduced in FIG. 2:

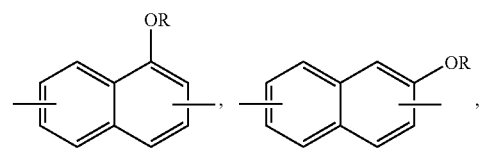

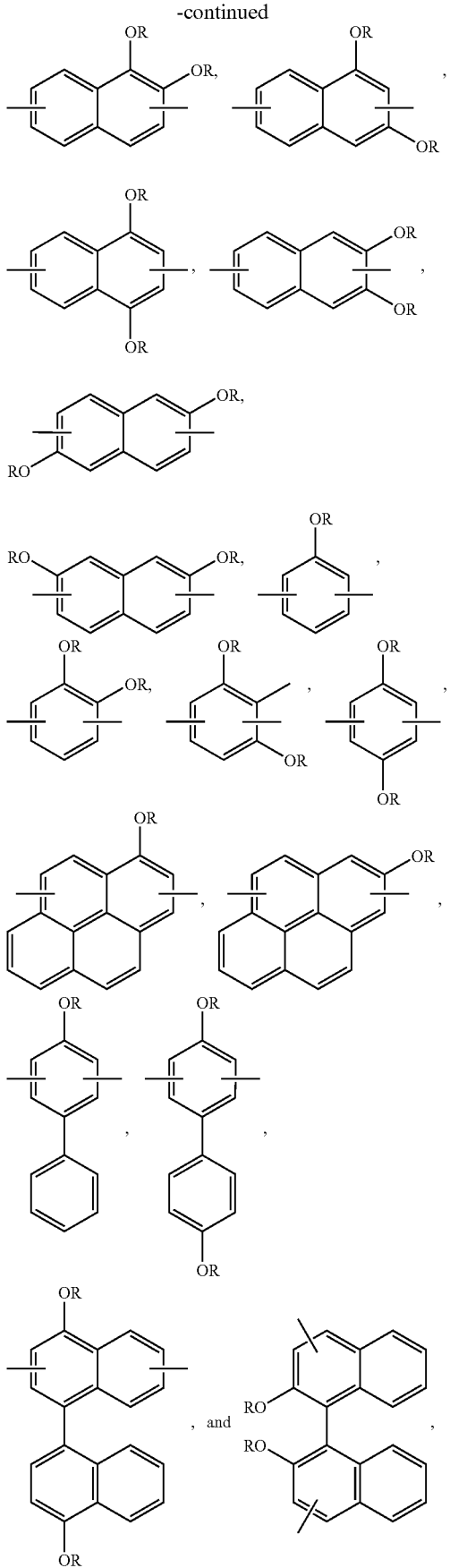

In $R_1$, R may be H or alkyl,

In Formula 1, $R_2$ may be one or more of the following moieties: hydrogen, hydroxyl, $C_1$-$C_{10}$ alkyl, $C_6$-$C_{10}$ aryl, allyl, and halogen.

Figure 3:
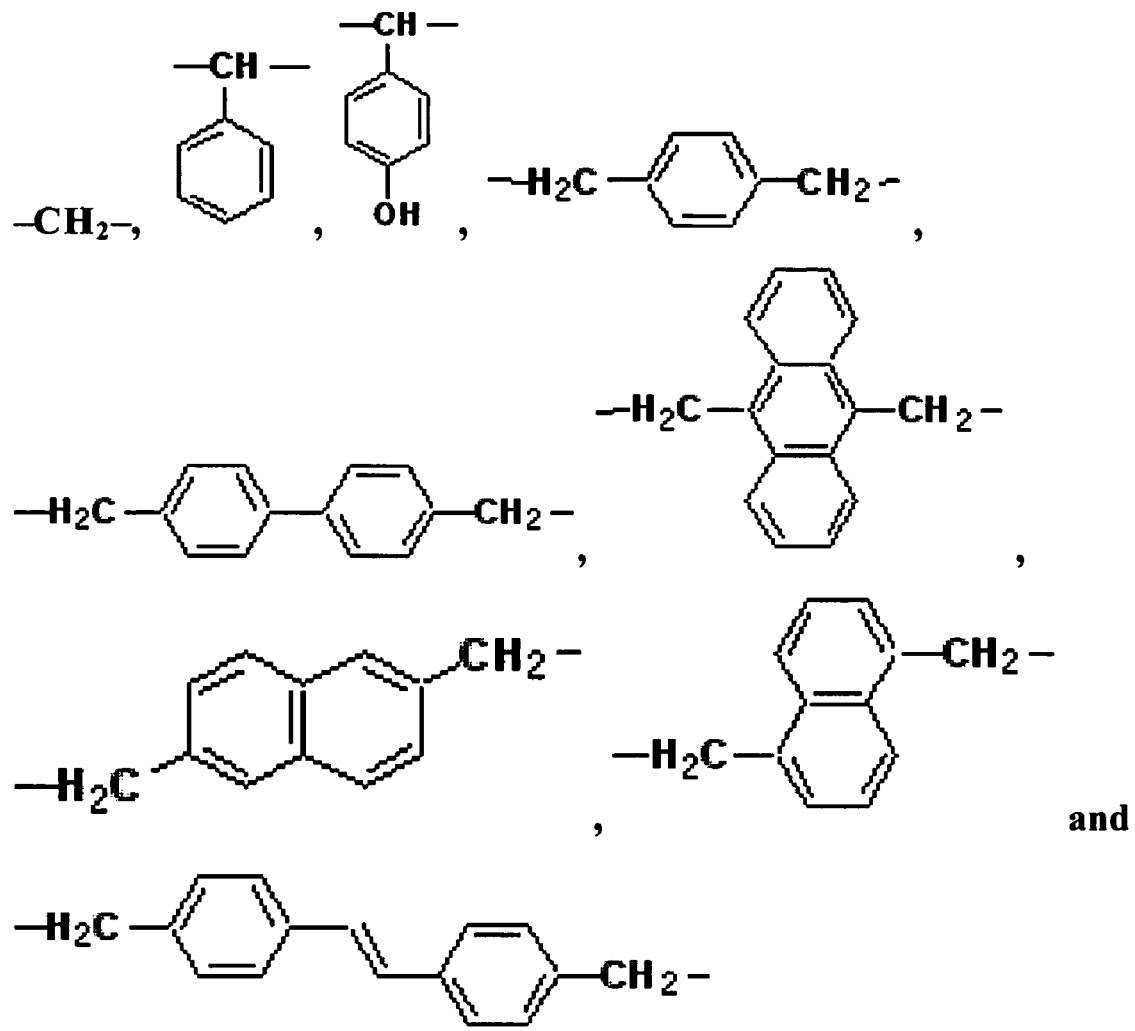
FIG. 3 illustrates example moieties corresponding to $R_3$ in Formula 1.

In Formula 1, $R_3$ may be one or more of the following moieties, which are reproduced in FIG. 3:

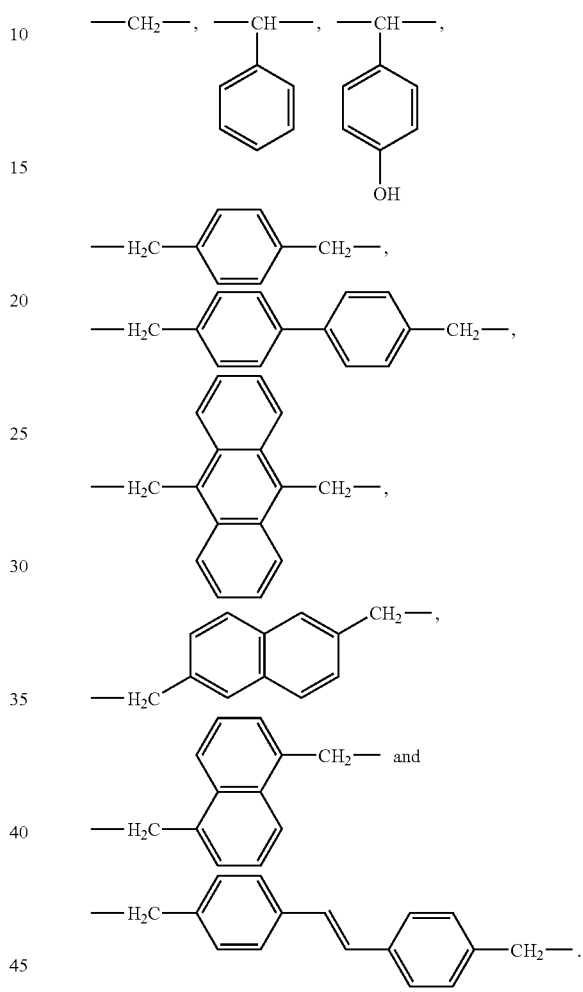

In Formula 1, n may satisfy the relationship $1 \leq n < 750$.

Figure 4:
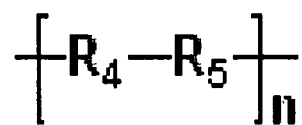
FIG. 4 illustrates Formula 2 of the hardmask composition according to an embodiment.

Formula 2 is reproduced in FIG. 4.

Formula 2:

Figure 5:
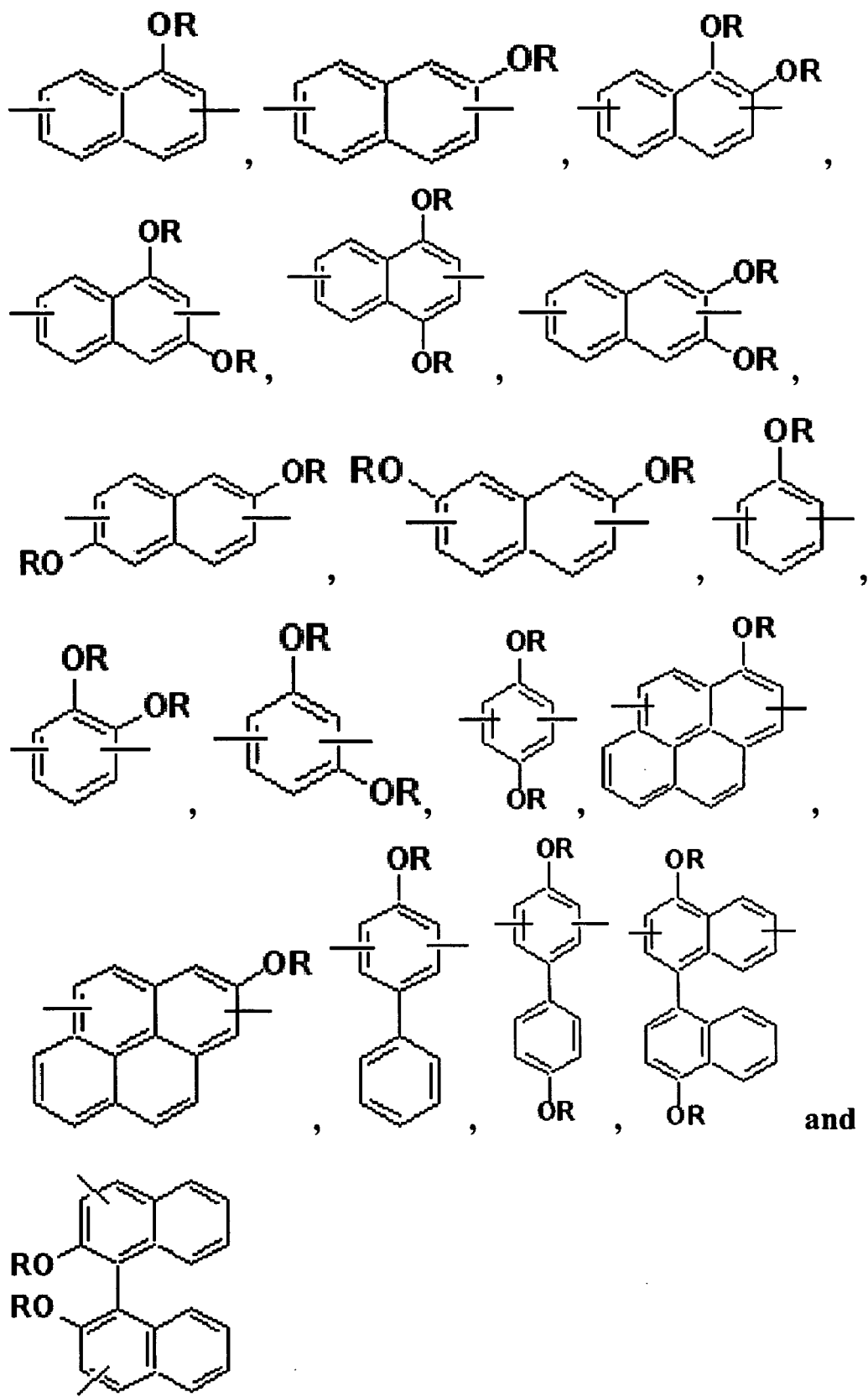
FIG. 5 illustrates example moieties corresponding to $R_4$ in Formula 2.

In Formula 2, $R_4$ may be one or more of the following moieties, which are reproduced in FIG. 5:

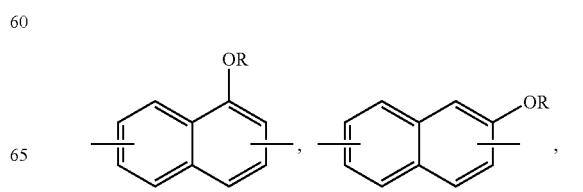

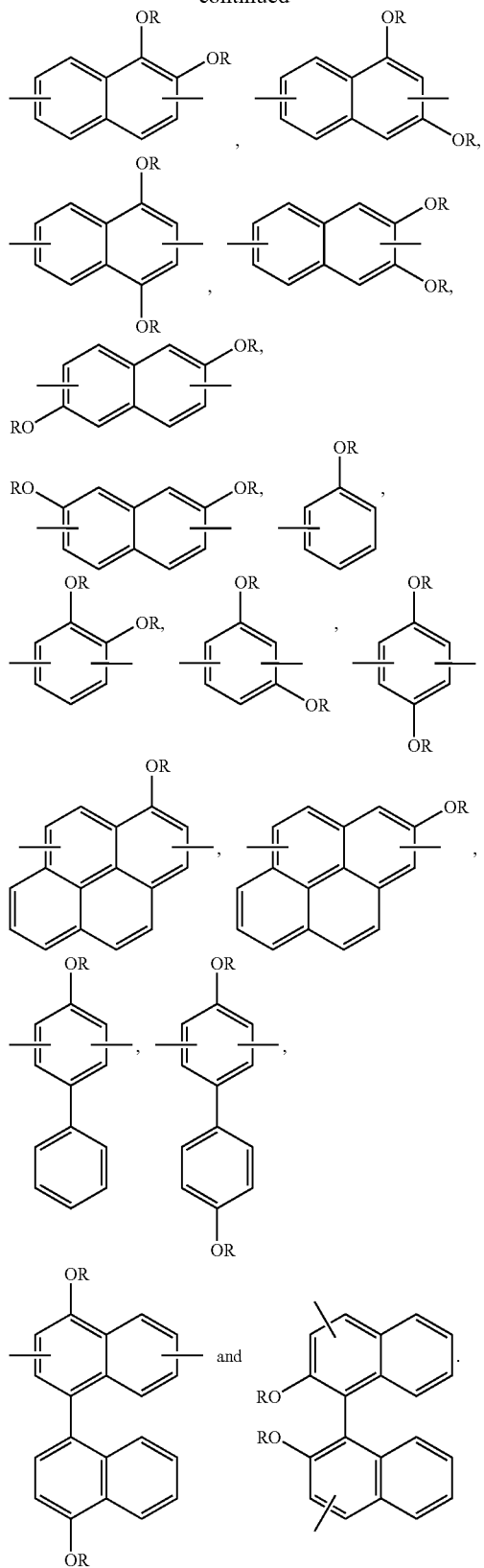

In $R_4$, R may be H or alkyl.

Figure 6:
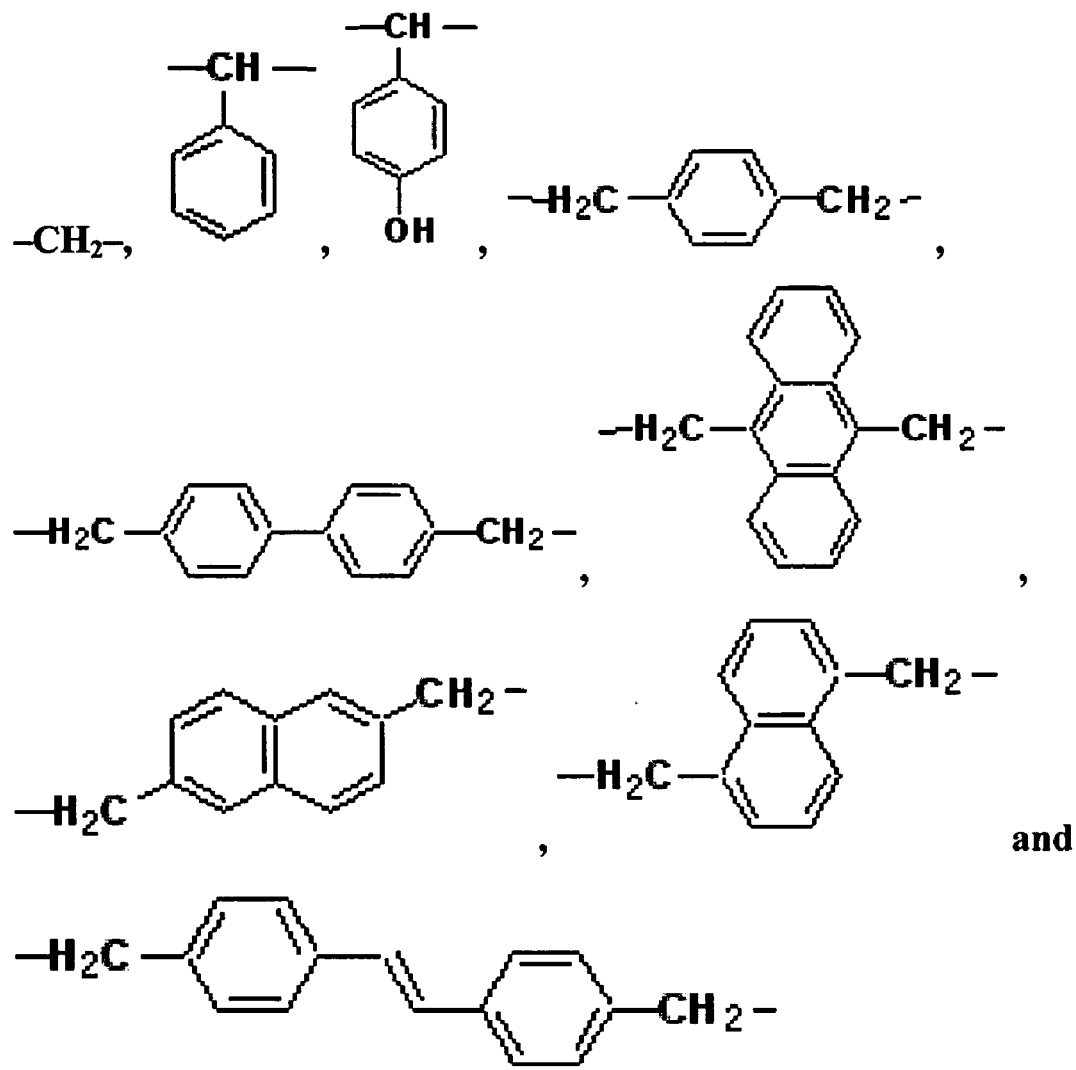
FIG. 6 illustrates example moieties corresponding to $R_5$ in Formula 2.

In Formula 2, $R_5$ may be one or more of the following moieties, which are reproduced in FIG. 6:

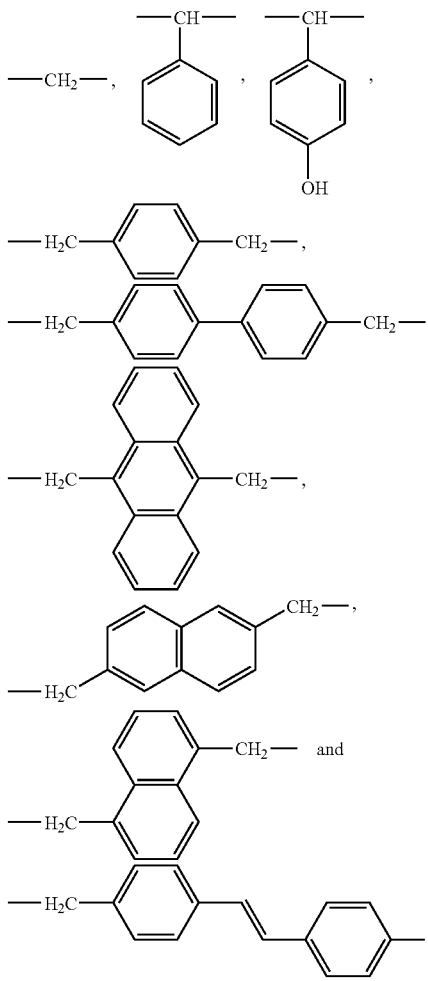

Figure 7:
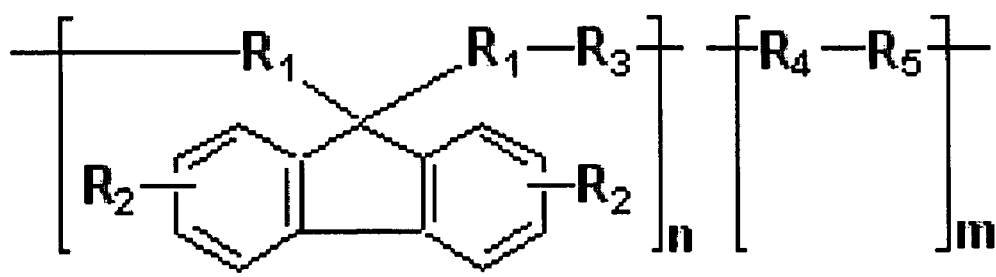
FIG. 7 illustrates Formula 3 of the hardmask composition according to an embodiment.
Figure 8:
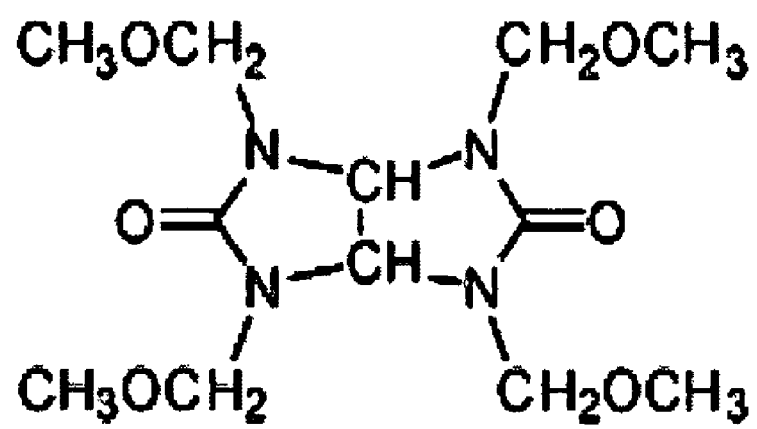
FIG. 8 illustrates Formula 4 of the hardmask composition according to an embodiment.
Figure 9:
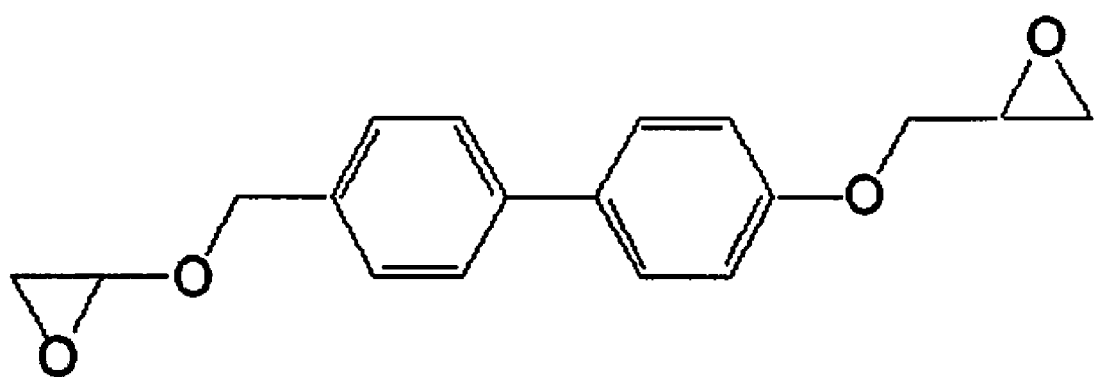
FIG. 9 illustrates Formula 5 of the hardmask composition according to an embodiment.
Figure 10:
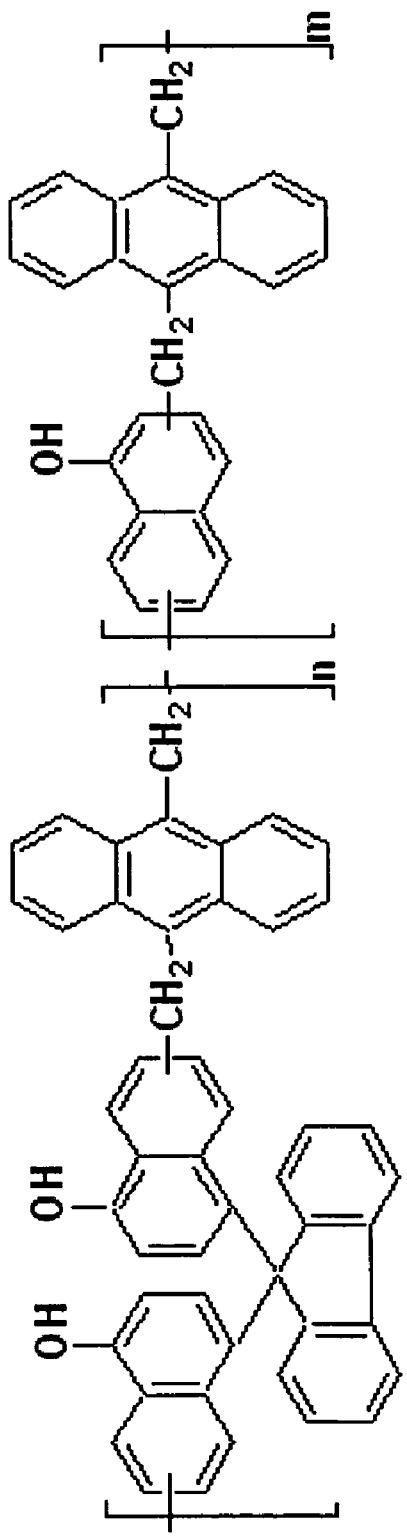
FIG. 10 illustrates Formula 6 of the hardmask composition according to an embodiment.
Figure 11:
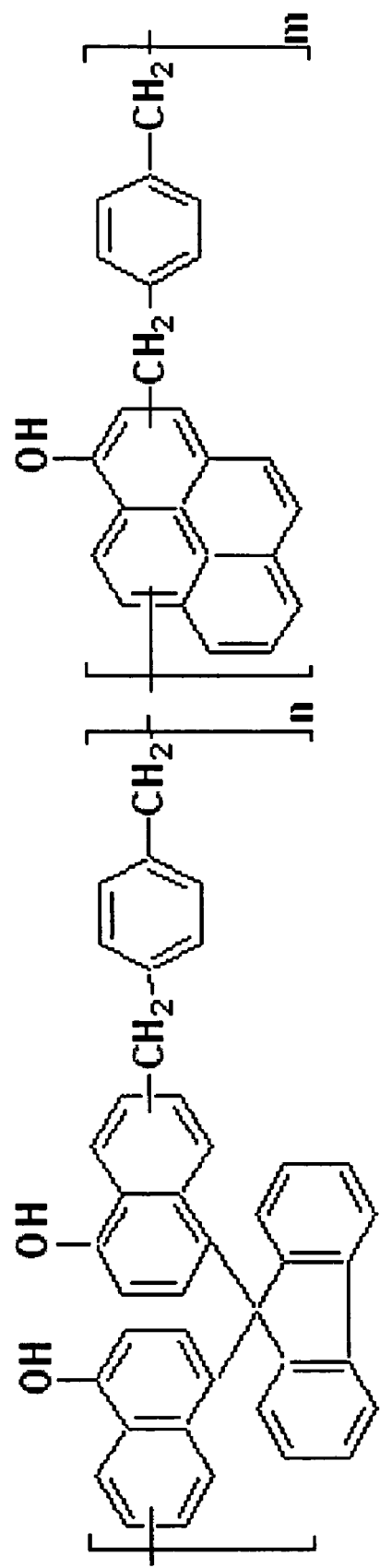
FIG. 11 illustrates Formula 7 of the hardmask composition according to an embodiment.
Figure 12:
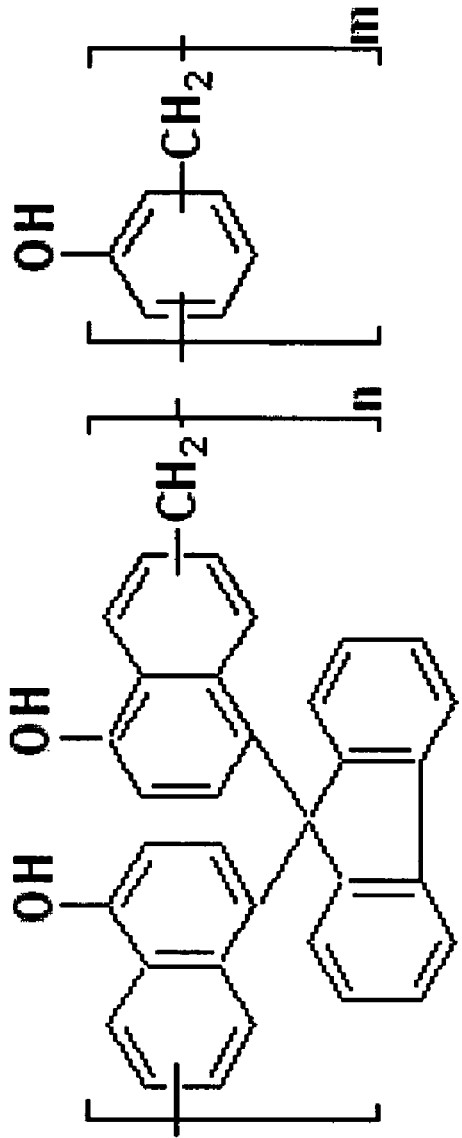
FIG. 12 illustrates Formula 8 of the hardmask composition according to an embodiment.
Figure 13:
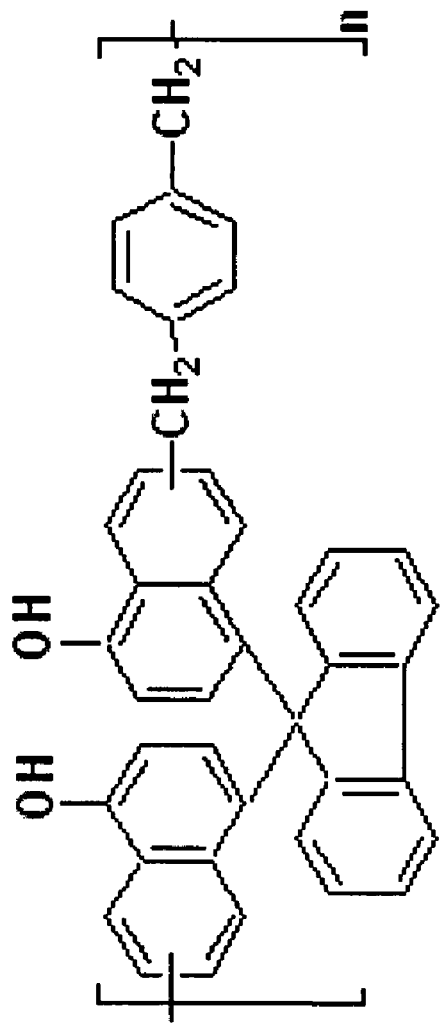
FIG. 13 illustrates Formula 9 of the hardmask composition according to an embodiment.
Figure 14:
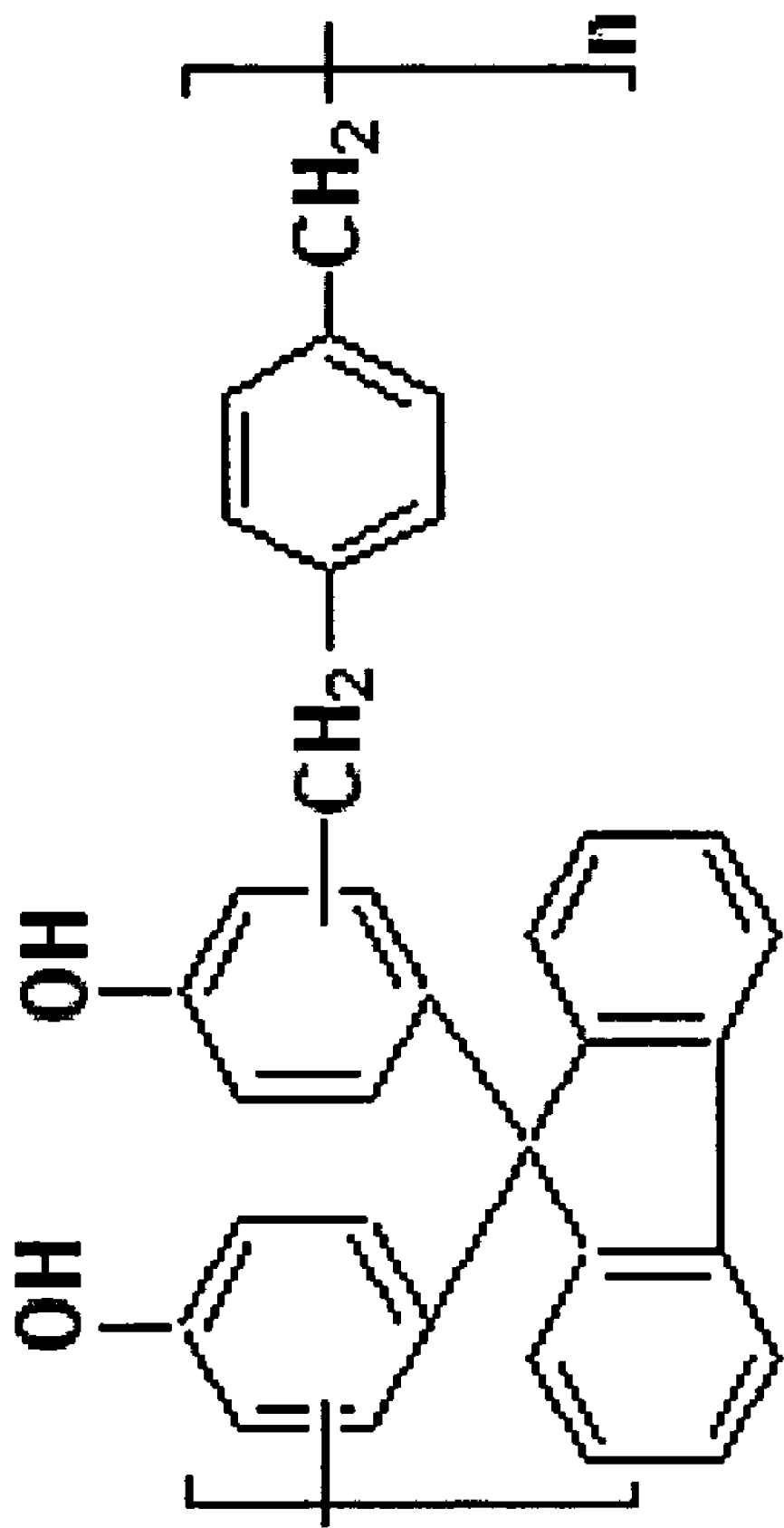
FIG. 14 illustrates Formula 10 of the hardmask composition according to an embodiment.
Figure 15:
FIG. 15 illustrates a flow chart of stages in a method of patterning a material on substrate according to an embodiment.
Figure 15:
Figure 15:
Figure 15:
Figure 15:
Figure 16A:
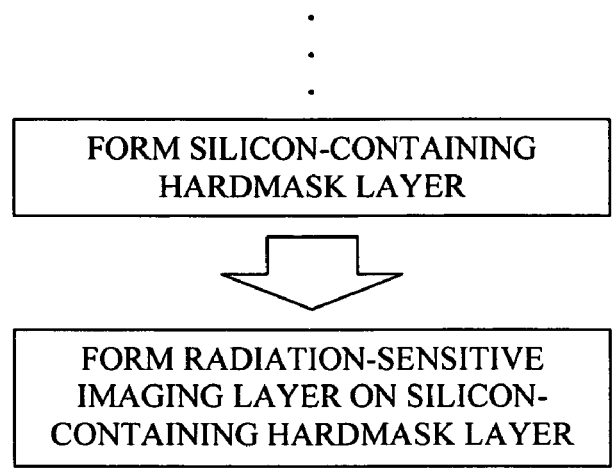
FIGS. 16A and 16B illustrate additional operations that may be performed in conjunction with the method described in connection with FIG. 15.
Figure 16B:
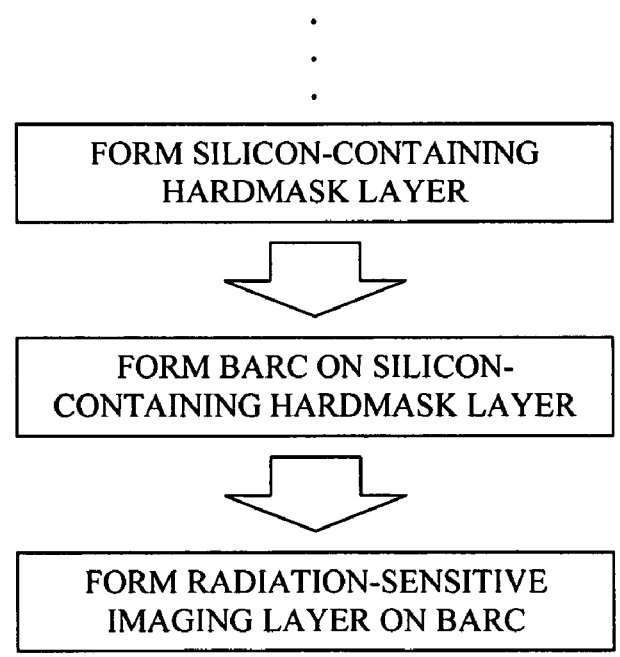

In Formula 2, n may satisfy the relationship $1 \leq n < 750$.
Formula 3 is reproduced in FIG. 7.
Formula 3:

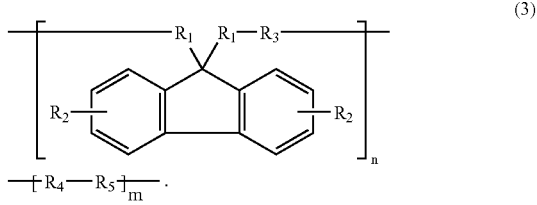

(3)

In Formula 3, $R_1$, $R_2$, $R_3$, $R_4$, $R_5$, and n may be the same as in Formulae 1 and 2. Further, in Formula 3, m may satisfy the relationship $1 \leq m < 750$, and m and n may satisfy the relationship $2 \leq (m+n) < 1{,}500$.

It is preferred that the aromatic ring-containing polymer (b) contains aromatic rings in the skeleton of the polymer. The aromatic rings may absorb light of short wavelengths, i.e., wavelengths of 248 nm or less. Accordingly, during lithography, the composition according to embodiments may be used to form a hardmask layer that minimizes the reflectivity between a resist and an underlying layer. Accordingly, the formation of an additional antireflective coating (ARC) may be omitted.

It is preferred that the aromatic ring-containing polymer has a number of reactive sites, e.g., hydroxyl (—OH) groups, distributed along the backbone chain of the polymer to react with a crosslinking component. The hydroxyl groups may react with the adjacent hydroxyl groups or the terminal alkoxy (—OCH$_3$) groups of the polymer ('self-crosslinking'). Self-crosslinking may allow the hardmask composition to be cured by baking without the use of an additional crosslinking component. In another implementation, the curing of the composition may be promoted by crosslinking with a crosslinking component in addition to or in lieu of self-crosslinking, i.e., a number of reactive sites, e.g., hydroxyl (—OH) groups, distributed along the backbone of the polymer may be crosslinked with a crosslinking component.

The hardmask composition may exhibit solution-and film-forming characteristics, which assist in the formation of a layer by a conventional spin-coating technique. Thus, the hardmask composition may satisfy a number of process requirements due to the presence of one or more of the aromatic ring-containing polymers represented by Formulae 1, 2 and 3.

The aromatic ring-containing polymers preferably have a weight average molecular weight of 1,000 to 30,000. Such a molecular weight may provide the aromatic ring-containing polymers with good solubility in the solvent and render the hardmask composition suitable for coating.

The total amount of the aromatic ring-containing polymer(s) (b) is preferably about 1 to about 30 parts by weight, based on 100 parts by weight of the organic solvent (a). Maintaining the amount of the aromatic ring-containing polymer(s) in a range of about 1 to about 30 parts by weight may provide a desired coating thickness and make it easier to regulate the coating thickness.

There is no particular limitation on the kind of the organic solvent (a) so long as the aromatic ring-containing polymer (b) can be sufficiently dissolved in the organic solvent (a). Exemplary suitable organic solvents include propylene glycol monomethyl ether acetate (PGMEA), propylene glycol monomethyl ether (PGME), cyclohexanone, and ethyl lactate.

The hardmask composition may further include a crosslinking component (c), which is preferably capable of crosslinking the repeating units of the polymer upon heating. The hardmask composition may further include an acid catalyst or a base catalyst (d), which preferably serves to catalyze the crosslinking component (c). It is more preferred that the acid or base catalyst (d) be thermally activated.

Any crosslinking component capable of reacting with the hydroxyl groups of the aromatic ring-containing polymer in a manner that can be catalyzed by the acid or base catalyst may be used without any particular limitation.

Specific examples of suitable crosslinking components for use in the hardmask composition include: etherified amino resins, methylated melamine resins such as N-methoxymethyl-melamine resins, butylated melamine resins such as N-butoxymethyl-melamine resins, methylated and butylated urea resins such as Cymel U-65 Resin and UFR 80 Resin (both manufactured by Cytec Industries, Inc. (U.S.A.)), glycoluril derivatives such as Powderlink 1174 (manufactured by Cytec Industries, Inc. (U.S.A.), and 2,6-bis(hydroxymethyl)-p-cresol.

Powderlink 1174 is a compound of Formula 4:

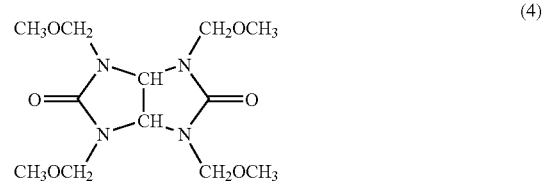

As the crosslinking component, a bisepoxy compound may be used, an example of which is shown in Formula 5:

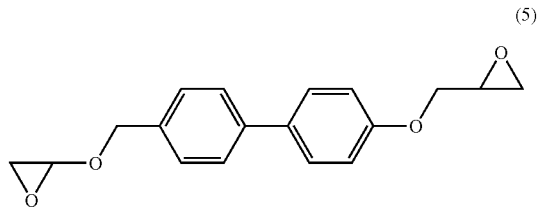

Exemplary acid catalysts include organic acids, e.g., p-toluenesulfonic acid monohydrate. To provide enhanced storage stability, a thermal acid generator ('TAG') may be used as the acid catalyst. A TAG is a compound that generates an acid upon thermal treatment such as heating. Examples of preferred TAGs include pyridinium p-toluenesulfonate, 2,4, 4,6-tetrabromocyclohexadienol, benzoin tosylate, 2-nitrobenzyl tosylate, and alkyl esters of organic sulfonic acids.

The base catalyst may include one or more ammonium hydroxides represented by NH$_4$OH or NR$_4$OH, where R is an alkyl group.

Other radiation-sensitive acid catalysts known in the field of resists can also be used so long as they are compatible with the other components of the antireflective composition according to embodiments.

In the hardmask composition, the organic solvent (a) is preferably present in an amount of about 75 to about 98.8% by weight, the aromatic ring-containing polymer (b) is preferably present in an amount of about 1 to about 20% by weight and more preferably about 3 to about 10% by weight, the crosslinking component (c) is preferably present in an amount of about 0.1 to about 5% by weight and more preferably about 0.1 to about 3% by weight, and the acid or base catalyst (d) is preferably present in an amount of about 0.001 to about 0.05% by weight and more preferably about 0.001 to about 0.03% by weight, where percent by weight is based on the weight of (a)+(b)+(c)+(d).

Maintaining the amount of the solvent and the aromatic ring-containing polymer in the above-described range may provide a desired coating thickness and make it easier to regulate the coating thickness.

When the content of the crosslinking component is less than 0.1% by weight, insufficient crosslinking may occur. When the content of the crosslinking component is greater than 5% by weight, deformation of a pattern profile may be caused and redeposition contamination may occur due to volatile components evolved upon baking.

When the content of the acid or base catalyst is less than 0.001% by weight, insufficient crosslinking may occur. When the content of the acid or base catalyst exceeds 0.05% by weight, the storage stability of the composition may be adversely affected.

The hardmask composition may further include one or more additives, such as a surfactant.

Embodiments also provide a method for patterning an underlying material layer on a substrate by using the hardmask composition. The method may include the following operations: (A) providing a material layer on a substrate, (B) forming a hardmask layer using the composition on the material layer, (C) forming a radiation-sensitive imaging layer on the hardmask layer, (D) patternwise exposing the radiation-sensitive imaging layer to radiation to form a pattern of radiation-exposed regions in the imaging layer, (E) selectively removing portions of the radiation-sensitive imaging layer and the hardmask layer to expose portions of the material layer, and (F) etching the exposed portions of the material layer to pattern the material layer.

The method may further include forming a silicon-containing hardmask layer prior to operation (C). The method may further include forming a bottom antireflective coating layer (BARC) on the silicon-containing hardmask layer prior to operation (C).

Specifically, the method may be carried out in accordance with the following procedure. First, a material to be patterned, e.g., aluminum, silicon nitride (SiN), etc., may be applied to a silicon substrate by a generally-known technique. The material may be an electrically conductive, semi-conductive, magnetic, or insulating material, etc. Thereafter, the hardmask composition according to an embodiment may be spin-coated to a thickness of about 500 Å to about 8,000 Å and baked at about 100° C. to about 300° C. for about 10 seconds to about 10 minutes to form a hardmask layer.

Thereafter, a silicon-containing hardmask composition may be spin-coated to a thickness of about 500 Å to about 4,000 Å on the hardmask layer and baked at about 100° C. to about 300° C. for about 10 seconds to about 10 minutes to form a silicon-containing hardmask layer. In an implementation, a bottom antireflective coating (BARC) may be formed on the silicon-containing hardmask layer.

A radiation-sensitive image layer may be formed on the hardmask layer. Light exposure and development may be performed to form a pattern on the imaging layer. Dry etching may be performed using a gas mixture, e.g., $CHF_3/CF_4$, through recessed portions of the patterned imaging layer to transfer the pattern to the silicon-containing hardmask layer. After the dry etching, a gas mixture, e.g., $BCl_3/Cl_2$, may be used to etch the exposed portions of the hardmask layer through the patterned silicon hardmask layer as a mask. As a result, the hardmask layer may be patterned. Dry etching may be performed using a gas mixture, e.g., $CHF_3/CF_4$, to pattern the material layer on the substrate.

Ashing may be performed to remove the remaining material, leaving the patterned material layer only. For example, the removal of the remaining material may be accomplished using oxygen plasma. The method according to embodiments may be applied to the fabrication of a semiconductor integrated circuit device.

The composition according to embodiments and the resulting lithographic structure may be used in the fabrication and design of integrated circuit devices. For example, the composition according to embodiments may be used in the formation of patterned material layer structures, such as metal wirings, holes for contacts and biases, insulating sections, e.g., damascene trenches (DTs) and shallow trench isolation (STI) structures, trenches for capacitor structures, etc. It should be appreciated that the composition and method according to embodiments are not restricted to any particular lithographic techniques or to forming particular device structures.

The following Examples are provided in order to set forth particular details of one or more example embodiments. However, it will be understood that the embodiments described herein are not limited to the particular details described in the Examples.

EXAMPLES

Synthesis Example 1

Synthesis of terpolymer of
9,9'-bishydroxynaphthylfluorene, 1-naphthol and
9,10-bismethoxymethylanthracene 450.5 g (1.0 mol) of 9,9'-bishydroxynaphthylfluorene, 144.2 g (1.0 mol) of 1-naphthol, 3.1 g (0.02 mol) of diethyl sulfate and 350 g of propylene glycol monomethyl ether were completely dissolved with stirring in a 3 L three-neck flask equipped with a mechanical agitator and a condenser while maintaining the temperature of the reactor at 100° C.

10 minutes after the dissolution, 532.7 g of (2.0 mol) of 9,10-bismethoxymethylanthracene was dropped into the solution, and then the resulting mixture was allowed to react at 120° C. for 15 hours. To the reaction mixture was added 2.98 g (0.02 mol) of triethanolamine as a neutralizing agent to quench the reaction.

After completion of the reaction, a water/methanol mixture was used to remove the acid from the reaction mixture, and methanol was used to remove low-molecular weight compounds containing the oligomers and monomers, yielding the polymer represented by Formula 6 ($M_w$=10,000, polydispersity=2.0, n=10, m=9).

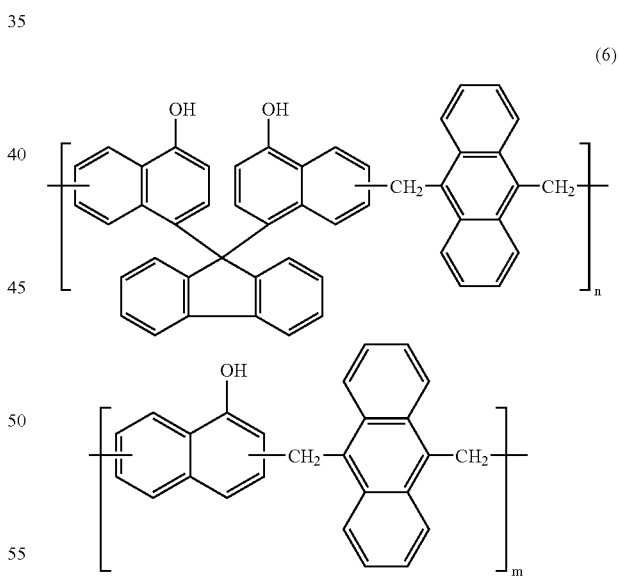

(6)

Synthesis Example 2

Synthesis of terpolymer of
9,9'-bishydroxynaphthylfluorene, 1-hydroxypyrene
and 1,4-bismethoxymethylbenzene The procedure of Synthesis Example 1 was repeated, except that 218.3 g (1 mol) of 1-hydroxypyrene was added instead of 144.2 g of 1-naphthol, and 332.9 g (2 mol) of 1,4-bismethoxymethylbenzene was added instead of 532.7 g of (2.0 mol) of 9,10-bismethoxymethylanthracene, yielding the copolymer of Formula 7:

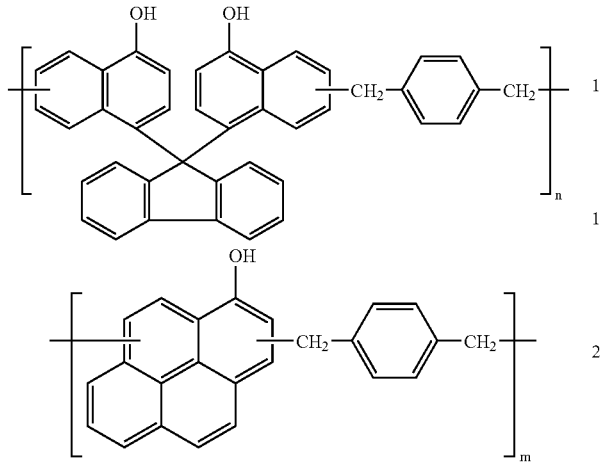

(7)

The molecular weight and the polydispersity of the copolymer were measured by gel permeation chromatography (GPC) in tetrahydrofuran. As a result, the copolymer was found to have a molecular weight of 11,000 (n=10, m=11) and a polydispersity of 2.2.

Synthesis Example 3

Synthesis of terpolymer of 9,9'-bishydroxynaphthylfluorene, phenol and formaldehyde The procedure of Synthesis Example 1 was repeated, except that 94.1 g (1.0 mol) of phenol was added instead of 144.2 g of 1-naphthol, and 60.1 g (2 mol) of formaldehyde was added instead of 532.7 g of (2.0 mol) of 9,10-bismethoxymethylanthracene, yielding the copolymer of Formula 8:

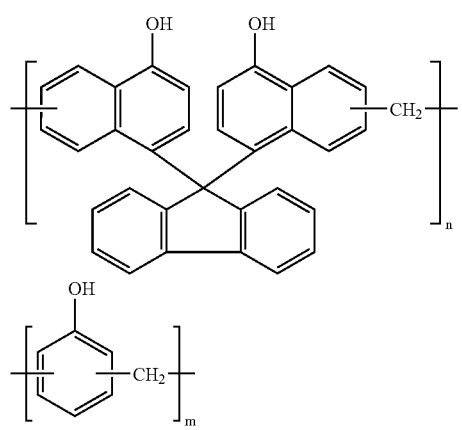

(8)

The molecular weight and the polydispersity of the copolymer were measured by gel permeation chromatography (GPC) in tetrahydrofuran. As a result, the copolymer was found to have a molecular weight of 10,000 (n=8, m=8) and a polydispersity of 1.8.

Synthesis Example 4

Synthesis of copolymer of 9,9'-bishydroxynaphthylfluorene and 1,4-bismethoxymethylbenzene and copolymer of 9,9'-bishydroxyphenylfluorene and 1,4-bismethoxymethylbenzene, and preparation of blend of the copolymers 450.5 g (1.0 mol) of 9,9'-bishydroxynaphthylfluorene, 3.1 g (0.02 mol) of diethyl sulfate and 250 g of propylene glycol monomethyl ether were completely dissolved with stirring in a 2 L three-neck flask equipped with a mechanical agitator and a condenser while maintaining the temperature of the reactor at 100° C. 10 minutes after the dissolution, 166.4 g (1.0 mol) of 1,4-bismethoxymethylbenzene was dropped into the solution, and then the resulting mixture was allowed to react at 120° C. for 24 hours.

To the reaction mixture was added 2.98 g (0.02 mol) of triethanolamine as a neutralizing agent to quench the reaction. After completion of the reaction, a water/methanol mixture was used to remove the acid from the reaction mixture, and methanol was used to remove low-molecular weight compounds containing the oligomers and monomers, yielding the polymer represented by Formula 9 ($M_w$=10,000, polydispersity=2.3, n=20).

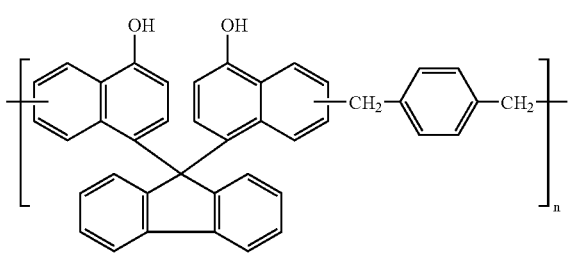

(9)

393.5 g (1.0 mol) of 9,9'-bishydroxyphenylfluorene, 3.1 g (0.02 mol) of diethyl sulfate and 250 g of propylene glycol monomethyl ether were completely dissolved with stirring in a 2 L three-neck flask equipped with a mechanical agitator and a condenser while maintaining the temperature of the reactor at 100° C. 10 minutes after the dissolution, 166.4 g of (1.0 mol) of 1,4-bismethoxymethylbenzene was dropped into the solution, and then the resulting mixture was allowed to react at 120° C. for 15 hours.

To the reaction mixture was added 2.98 g (0.02 mol) of triethanolamine as a neutralizing agent to quench the reaction. After completion of the reaction, a water/methanol mixture was used to remove the acid from the reaction mixture, and methanol was used to remove low-molecular weight compounds containing the oligomers and monomers, yielding the polymer represented by Formula 10 ($M_w$=10,000, polydispersity=1.9, n=22).

(10)

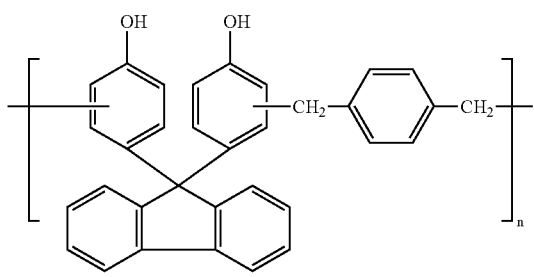

The polymers of Formulae 9 and 10 were mixed together in a ratio of 9:1 to prepare a blend.

Examples 1 to 4

0.8 g of each of the polymers prepared in Synthesis Examples 1 to 4, 0.2 g of Powderlink 1174 (Formula 4) as a crosslinker and 2 mg of pyridinium p-toluenesulfonate were dissolved in 9 g of propylene glycol monomethyl ether acetate (PGMEA), and filtered to prepare a sample solution.

Each of the sample solutions prepared in Examples 1 to 4 was spin-coated on a silicon wafer and baked at 200° C. for 60 seconds to form a 4,000 Å-thick film.

The refractive index (n) and extinction coefficient (k) of the films were measured using an ellipsometer (J. A. Woollam). The results are shown in Table 1.

The data of Table 1 show that the films are suitable for use as antireflective films at 193 nm (ArF) and 248 nm (KrF).

TABLE 1

| Sample used in the formation of film | Optical properties (193 nm) | | Optical properties (248 nm) | |
|---|---|---|---|---|
| | Refractive index (n) | Extinction coefficient (k) | Refractive index (n) | Extinction coefficient (k) |
| Example 1 | 1.47 | 0.65 | 1.90 | 0.20 |
| Example 2 | 1.43 | 0.30 | 2.11 | 0.28 |
| Example 3 | 1.44 | 0.71 | 1.80 | 0.06 |
| Example 4 | 1.43 | 0.69 | 1.83 | 0.07 |

Examples 5 to 8

Each of the sample solutions prepared in Examples 1 to 4 was spin-coated on a silicon wafer covered with silicon nitride and baked at 200° C. for 60 seconds to form a 4,000 Å-thick film.

A silicon antireflective coating (ARC) was formed on the film and baked at 240° C. for 60 seconds. Thereafter, an ArF photoresist (PR) was coated to a thickness of 1,700 Å on the silicon ARC, baked at 110° C. for 60 seconds, exposed to light using an ArF exposure system (ASML, XT: 1400, NA 0.93), and developed with an aqueous solution of TMAH (2.38 wt %) to form a 63-nm line and space pattern. The patterns were observed using a field emission scanning electron microscope (FE-SEM). The patterns were measured for exposure latitude (EL) margin as a function of exposure energy and depth of focus (DoF) margin as a function of the distance from a light source. The results are recorded in Table 2.

TABLE 2

| Sample used in the formation of film | Pattern properties | | |
|---|---|---|---|
| | EL margin (Δ mJ/exposure energy mJ) | DoF margin (μm) | Profile |
| Example 5 | 4 | 0.25 | Cubic |
| Example 6 | 4 | 0.25 | Cubic |
| Example 7 | 4 | 0.25 | Cubic |
| Example 8 | 4 | 0.25 | Cubic |

Examples 9 to 12

Each of the silicon ARCs of the patterned specimens (Examples 5 to 8) was dry-etched using a gas mixture of $CHF_3/CF_4$ through a photoresist (PR) as a mask. The hardmask was dry-etched using a gas mixture of $O_2/N_2$ through the silicon ARC as a mask. Thereafter, the silicon nitride was dry-etched using a gas mixture of $CHF_3/CF_4$ through the hardmask as a mask. $O_2$ ashing and wet stripping were performed on the remaining portions of the hardmask and the organic material.

Immediately after etching of the hardmask and the silicon nitride, the cross sections of the specimens were observed using an FE-SEM. The results are listed in Table 3.

The etched patterns all showed good profiles without being bowed or tapered. The reason for good etching of the silicon nitride is believed to be because the hardmasks were sufficiently resistant to the etching gas.

TABLE 3

| Sample used in the formation of film | Pattern shape after etching of hardmask | Pattern shape after etching of silicon nitride |
|---|---|---|
| Example 9 | Vertical (Anisotropic) | Vertical (Anisotropic) |
| Example 10 | Vertical (Anisotropic) | Vertical (Anisotropic) |
| Example 11 | Vertical (Anisotropic) | Vertical (Anisotropic) |
| Example 12 | Vertical (Anisotropic) | Vertical (Anisotropic) |

As described above, a hardmask composition according to embodiments may be used to form a film having a refractive index and an absorbance suitable for use as an antireflective film in the deep UV (DUV) range, e.g., ArF (193 nm) and KrF (248 nm). The hardmask composition may also exhibit very high etch selectivity for lithography. In addition, since the hardmask composition may be resistant to multiple etching operations, it may be used to form a hardmask having a very good etch profile. Therefore, a good image may be transferred to an underlying layer. Furthermore, since the hardmask composition may minimize reflectivity between a resist and an underlying layer, it may be used to provide a lithographic structure that has better results in terms of pattern profile and margins. A hardmask composition according to embodiments may provide a high-density networking polymer with high carbon content in an amorphous structure that can be used to form a hardmask having an anisotropic profile.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A hardmask composition, comprising:
   (a) an organic solvent; and
   (b) at least one aromatic ring-containing polymer, the at least one aromatic ring-containing polymer including an aromatic ring-containing polymer represented by Formula 3:

Formula 3:

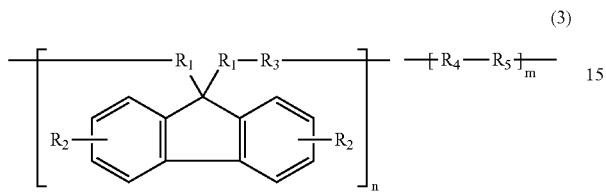

wherein, in Formula 3:

each $R_1$ is selected from:

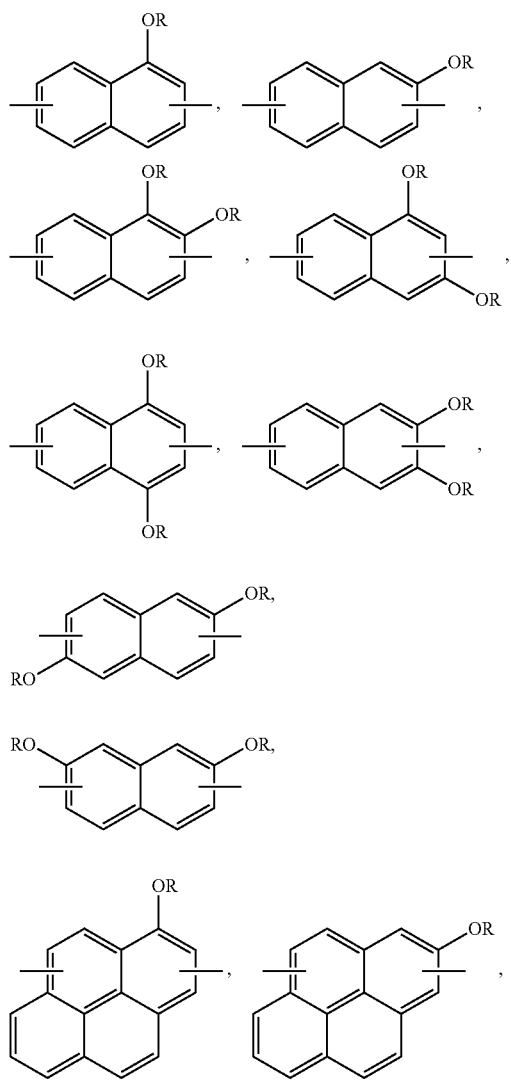

where, in $R_1$, R is H or alkyl, each $R_2$ is selected from:

hydrogen, hydroxyl, $C_1$-$C_{10}$ alkyl, $C_6$-$C_{10}$ aryl, allyl, and halogen, $R_3$ is selected from:

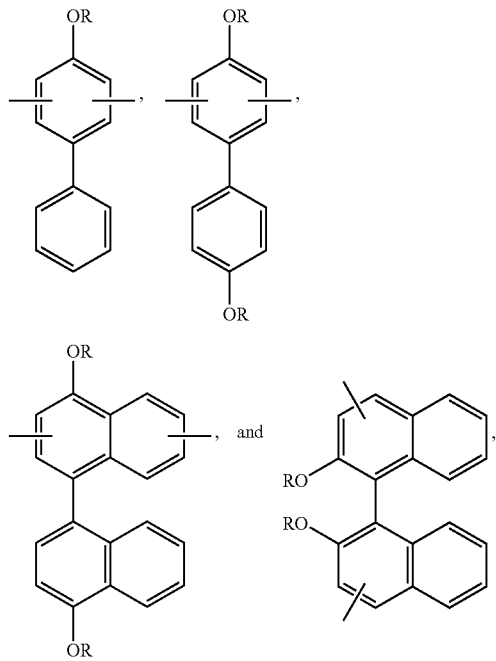

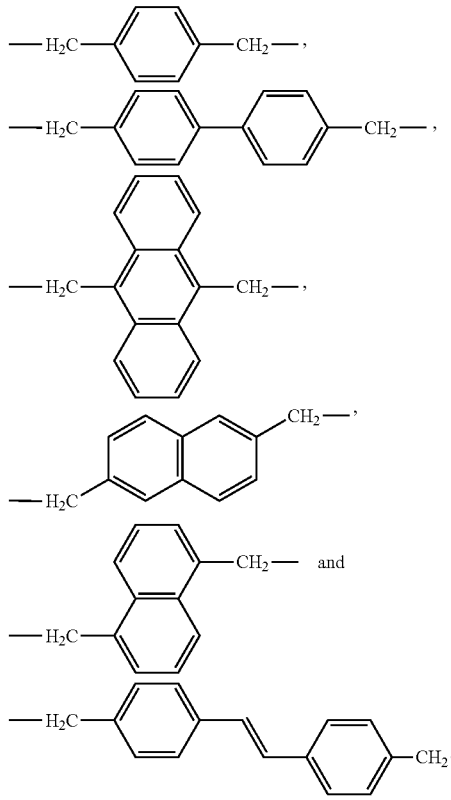

-continued

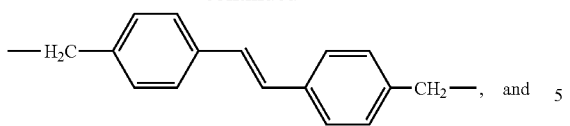

$R_4$ is selected from:

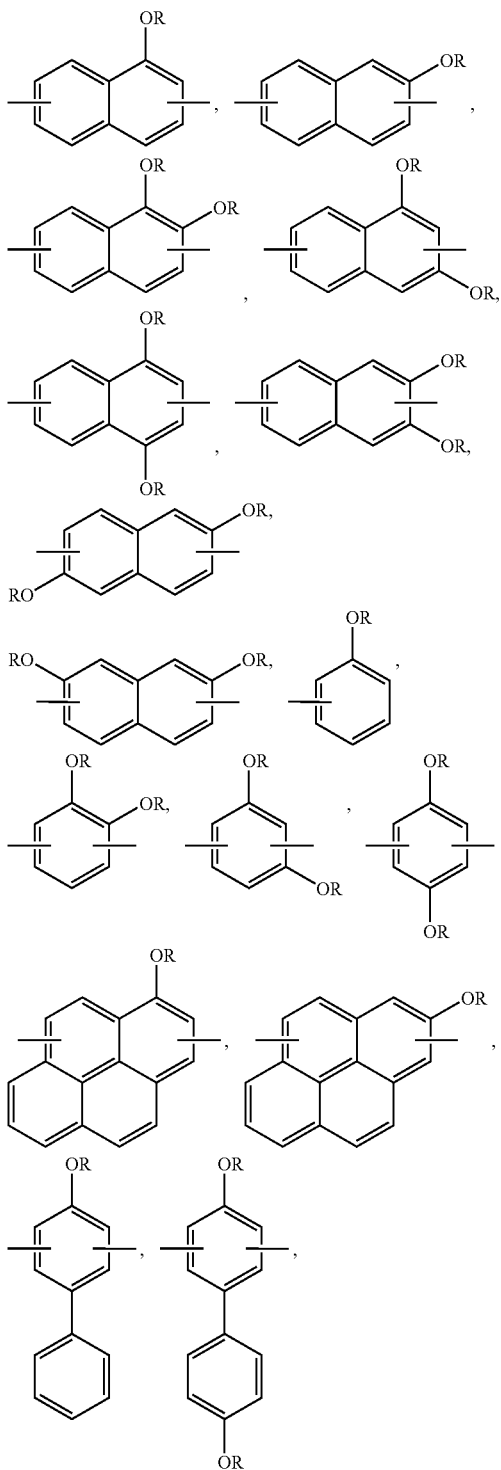

-continued

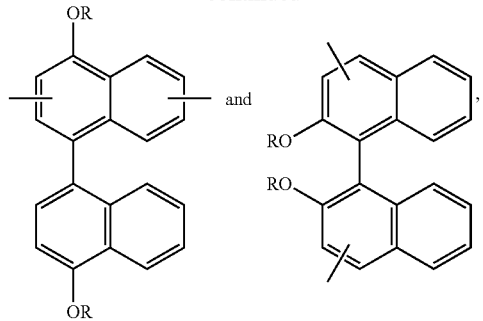

where, in $R_4$, R is H or alkyl,
$R_5$ is selected from:

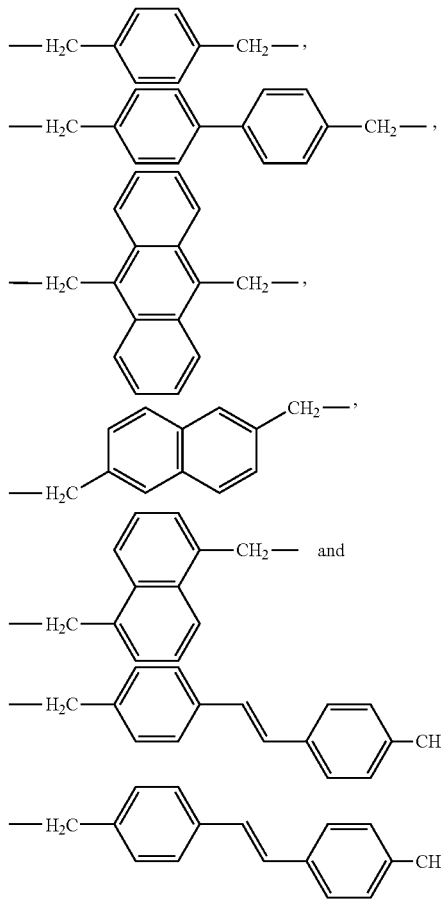

m and n satisfy $1 \leq n < 750$ and $1 \leq m < 750$.

2. The composition as claimed in claim 1, wherein the aromatic ring-containing polymer represented by Formula 3 has a weight average molecular weight of about 1,000 to about 30,000.

3. The composition as claimed in claim 1, further comprising (c) a crosslinking component.

4. The composition as claimed in claim 3, wherein the crosslinking component (c) includes one or more of a melamine resin, an amino resin, a glycoluril compound, or a bisepoxy compound.

5. The composition as claimed in claim 3, further comprising (d) an acid catalyst or a base catalyst.

6. The composition as claimed in claim 5, wherein:
(d) includes the acid catalyst, and
the acid catalyst includes one or more of p-toluenesulfonic acid monohydrate, pyridinium p-toluenesulfonate, 2,4,4,6-tetrabromocyclohexadienone, benzoin tosylate, 2-nitrobenzyl tosylate, or alkyl esters of organic sulfonic acids.

7. The composition as claimed in claim 5, wherein:
(d) includes the base catalyst, and
the base catalyst includes one or more ammonium hydroxides represented by $NH_4OH$ or $NR_4OH$, where R=alkyl.

8. The composition as claimed in claim 5, wherein the composition comprises:
about 75 to about 98.8% by weight of the organic solvent (a),
about 1 to about 20% by weight of the at least one aromatic ring-containing polymer (b),
about 0.1 to about 5% by weight of the crosslinking component (c), and
about 0.001 to about 0.05% by weight of the acid or base catalyst (d), percent by weight being determined based on the weight of (a)+(b)+(c)+(d).

9. The composition as claimed in claim 1, further comprising a surfactant.

10. A method for patterning a material on a substrate, the method comprising:
providing a material layer on a substrate;
forming a hardmask layer using the composition as claimed in claim 1 on the material layer;
forming a radiation-sensitive imaging layer on the hardmask layer;
patternwise exposing the radiation-sensitive imaging layer to radiation to form a pattern of radiation-exposed regions in the imaging layer;
removing portions of the radiation-sensitive imaging layer and the hardmask layer to expose portions of the material layer; and
etching the exposed portions of the material layer to pattern the material layer.

11. The method as claimed in claim 10, further comprising forming a silicon-containing hardmask layer prior to forming the radiation-sensitive imaging layer on the hardmask layer.

12. The method as claimed in claim 11, further comprising forming a bottom antireflective coating on the silicon-containing hardmask layer prior to forming the radiation-sensitive imaging layer on the hardmask layer.

* * * * *